United States Patent
Kasuya et al.

(10) Patent No.: US 7,608,930 B2
(45) Date of Patent: Oct. 27, 2009

(54) SEMICONDUCTOR DEVICE AND METHOD OF MANUFACTURING SEMICONDUCTOR DEVICE

(75) Inventors: Yasumasa Kasuya, Kyoto (JP); Motoharu Haga, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 12/078,772

(22) Filed: Apr. 4, 2008

(65) Prior Publication Data

US 2008/0246132 A1 Oct. 9, 2008

(30) Foreign Application Priority Data

Apr. 5, 2007 (JP) .............................. 2007-099221

(51) Int. Cl.
*H01L 29/40* (2006.01)

(52) U.S. Cl. ............... 257/779; 257/784; 257/E23.054; 438/111; 438/112

(58) Field of Classification Search .................. 438/111, 438/112; 257/779, 784, E23.054

See application file for complete search history.

(56) References Cited

U.S. PATENT DOCUMENTS

2007/0126092 A1* 6/2007 San Antonio et al. ........ 257/674
2007/0176267 A1* 8/2007 Abbott ......................... 257/666

FOREIGN PATENT DOCUMENTS

JP 2006-140265 6/2006

\* cited by examiner

*Primary Examiner*—Trung Dang
(74) *Attorney, Agent, or Firm*—Rabin & Berdo, PC

(57) ABSTRACT

This semiconductor device includes a semiconductor chip, and a lead arranged around the semiconductor chip to extend in a direction intersecting with the side surface of the semiconductor chip, and having at least an end farther from the semiconductor chip bonded to a package board, wherein a joint surface to the package board and an end surface orthogonal to the joint surface are formed on the end of the lead farther from the semiconductor chip, and a metal plating layer made of a pure metal is formed on the end surface.

14 Claims, 11 Drawing Sheets

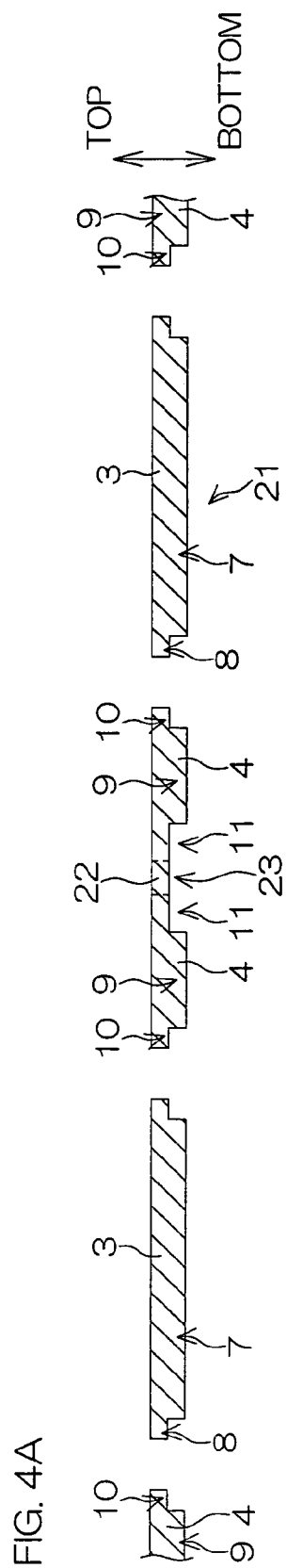

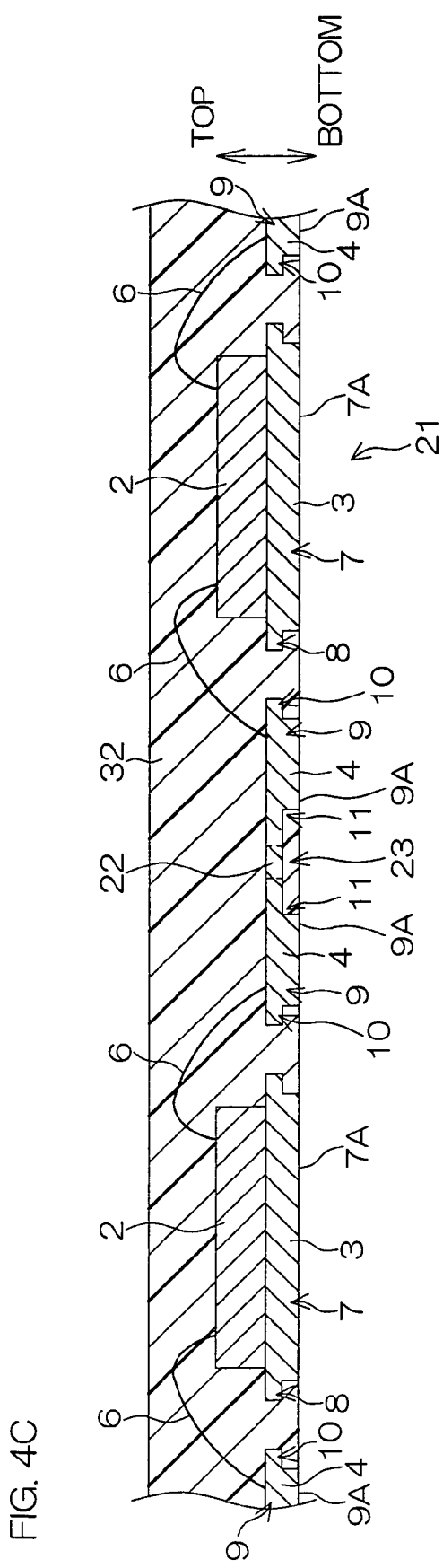

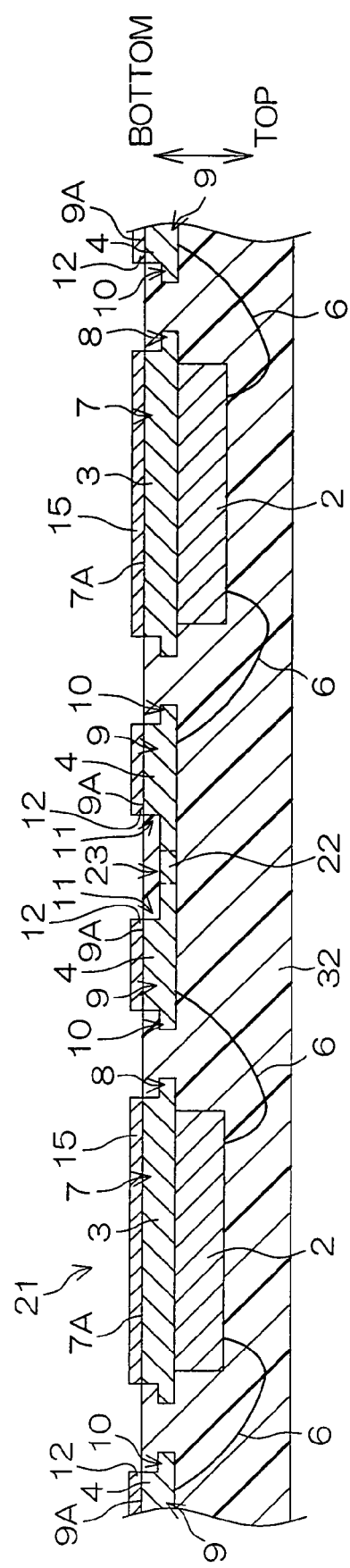

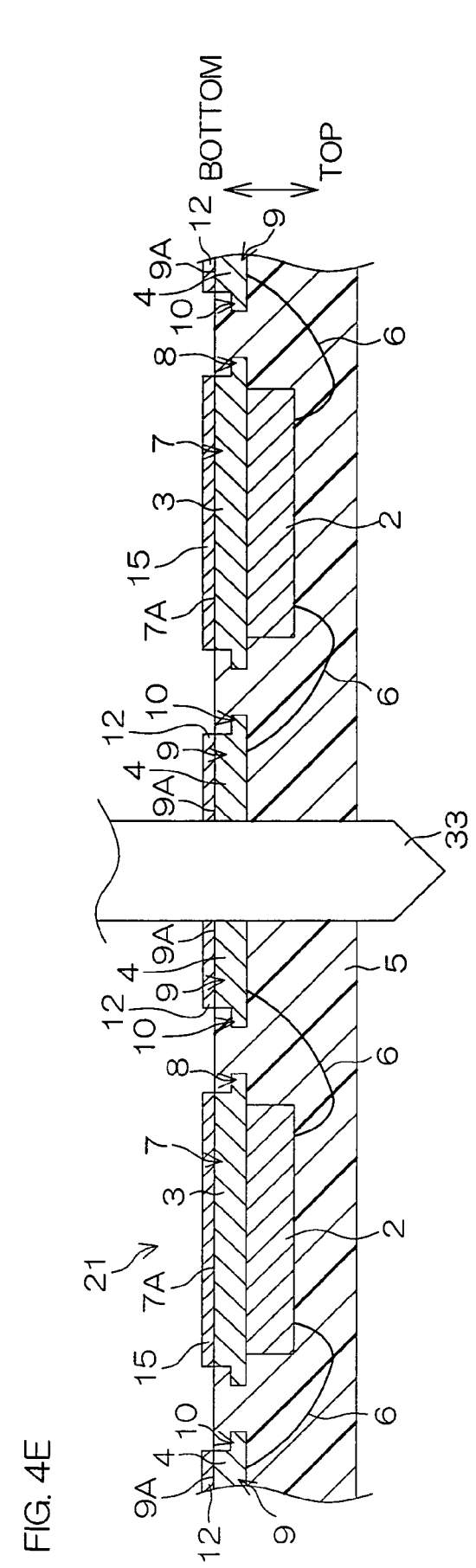

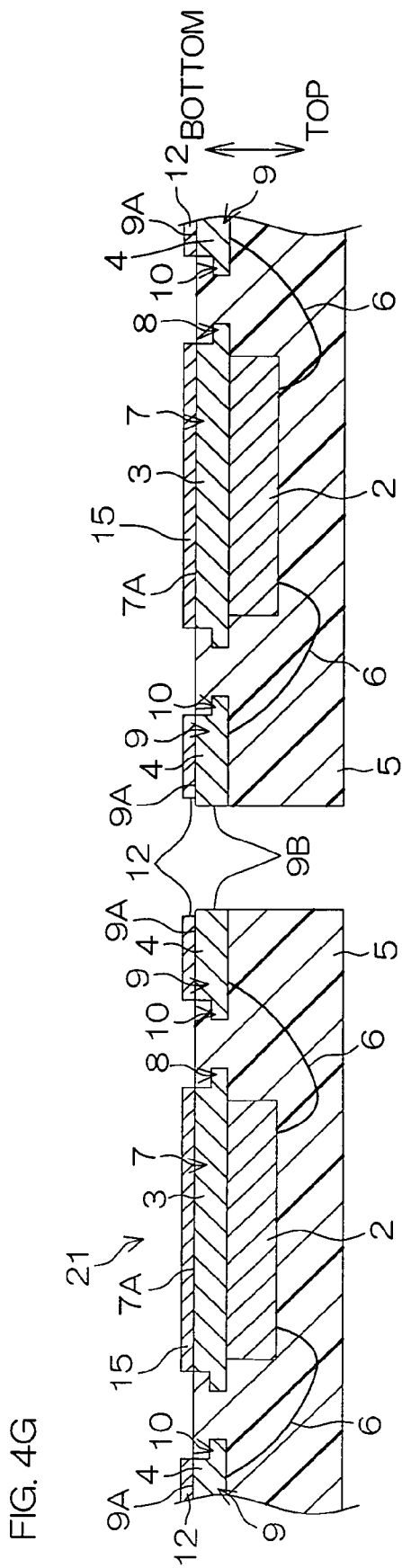

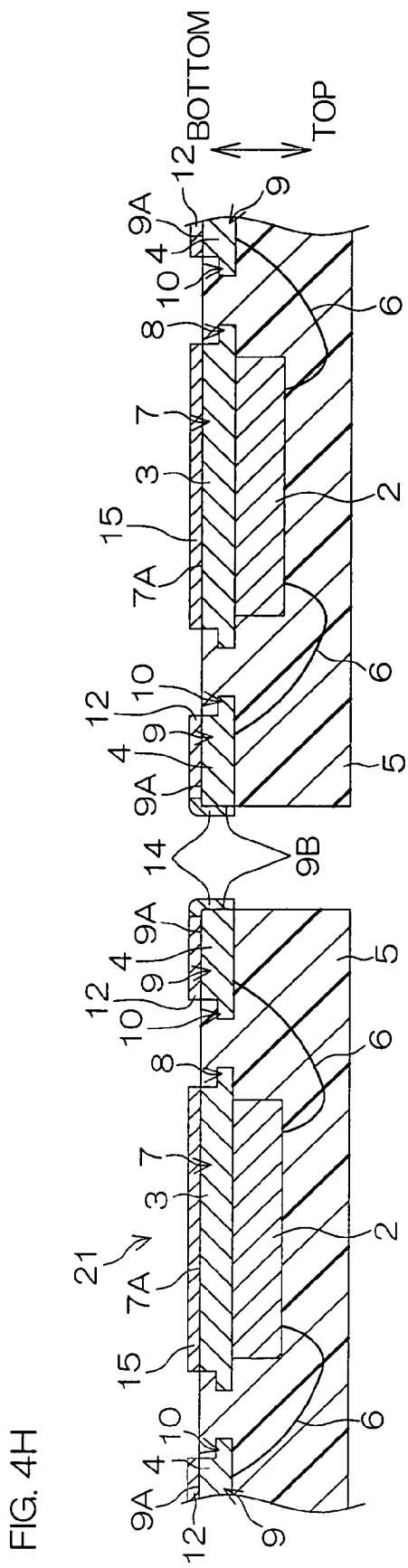

SEMICONDUCTOR DEVICE AND METHOD OF MANUFACTURING SEMICONDUCTOR DEVICE

TECHNICAL FIELD

The present invention relates to a semiconductor device and a method of manufacturing this semiconductor device.

DESCRIPTION OF RELATED ART

Following downsizing of electronic devices, a semiconductor device to which a QFN (Quad Flat Non-leaded Package) is applied is increasingly demanded.

The semiconductor device to which a QFN is applied is prepared in a MAP (Molded Array Packaging) system, for example. In the MAP system, a plurality of semiconductor chips are collectively sealed with sealing resin on a lead frame, and thereafter singulated into individual semiconductor devices each including a semiconductor chip.

The lead frame is made of copper, for example. This lead frame includes a latticed support portion. A rectangular die pad and a plurality of leads are formed in each rectangular region surrounded by the support portion. The leads are arranged around the die pad. Each lead extends in a direction opposed to the die pad. More specifically, each lead is formed in a long shape having a base end connected to the support portion and a free end extending toward the die pad.

After each semiconductor chip is die-bonded onto the corresponding die pad, terminals formed on the semiconductor chip and the upper surfaces of the leads around the same are connected (wire-bonded) with one another through bonding wires. When all semiconductor chips are completely wire-bonded, the lead frame is set in a molding die, and all semiconductor chips provided on the lead frame are collectively sealed with the sealing resin so as to expose the lower surfaces of the die pads and those of the leads. Solder plating layers are formed on the lower surfaces of the die pads and those of the leads exposed from the sealing resin. Thereafter a dicing saw is introduced from under the lower surface of the lead frame along dicing lines set on the support portion, to remove the support portion and the sealing resin on the support portion. Thus, the leads are separated from the support portion, and each individual semiconductor device is obtained.

Solder is applied to a land provided on a package board to be mounted with this semiconductor device. The semiconductor device is mounted on the package board by arranging the semiconductor device on a position where the surface of the land of the package board (wiring board) and the lower surfaces of the leads are opposed to one another and performing reflow treatment while bringing the respective lower surfaces of the leads into contact with the solder on the lands.

Patent Document 1: Japanese Unexamined Patent Publication No. 2006-140265

DISCLOSURE OF THE INVENTION

Problems to be Solved

However, the end surfaces of the leads of the semiconductor device are exposed from the sealing resin when the leads are separated from the support portion with the dicing saw. Therefore, copper forming the leads is bared on these surfaces, and the bared copper is disadvantageously oxidized. When the semiconductor device is mounted on the package board, therefore, the solder provided on the package board (land) is hard to wet onto the end surfaces (oxidized copper) of the leads, despite the reflow treatment. Consequently, only the lower surfaces of the leads of the semiconductor device may be bonded to the package board. Therefore, the conventional semiconductor device is not necessarily strongly mounted on the package board.

The appearance test (defectiveness/nondefectiveness) of the bonded (soldered) state between the leads and the land is performed (determined) with reference to whether or not heaps of solder (solder fillets) are formed on the end surfaces of the leads. However, formation of such solder fillets depends on the state of solder wetting on the end surfaces of the leads, and hence the appearance test of the bonded state between the leads and the land is hard to be performed.

Therefore, an object of the present invention is to provide a semiconductor device capable of wetting solder onto the end surface of a lead when mounted on a package board and a method of manufacturing the same.

Solution to the Problems

A semiconductor device of the present invention includes: a semiconductor chip, and a lead arranged around the semiconductor chip to extend in a direction intersecting with the side surface of the semiconductor chip, and having at least an end farther from the semiconductor chip bonded to a package board, wherein a joint surface to the package board and an end surface orthogonal to this joint surface are formed on the end of the lead farther from the semiconductor chip, and a metal plating layer made of a pure metal is formed on the end surface.

In the semiconductor device, the joint surface to the package board and the end surface orthogonal to this joint surface are formed on the end of the lead farther from the semiconductor chip. The metal plating layer made of a pure metal is formed on this end surface.

This semiconductor device is mounted on the package board by a reflow system, for example. At the mounting by the reflow system, the package board having a land coated with solder on the surface thereof is prepared, and the semiconductor device is arranged on a position where the joint surface of the lead is opposed to the surface of the land. In this state, the package board is introduced into a reflow furnace, and preheated to a predetermined temperature along with the semiconductor device. Thereafter the package board and the semiconductor device are heated to a temperature (reflow temperature) not less than the melting point of solder. Thus, the solder is melted and integrated with the joint surface of the lead, and the semiconductor device is mounted on the package board.

If the metal plating layer is made of a pure metal having excellent diffusibility into the solder provided on the surface of the land and excellent wettability to this solder, the solder can be wet onto the end surface of the lead. In other words, the end surface of the lead can be integrated with the solder. Consequently, the mounting strength of the semiconductor device to the package board can be improved, thereby improving packaging reliability. Further, the so-called solder fillet can be formed on the end surface of the lead, whereby the appearance test of the bonded (soldered) state between the lead and the package board can be easily performed.

Preferably, the metal plating layer is made of a pure metal having a melting point of not more than 260° C.

A general reflow temperature for solder is 260° C. If the metal plating layer is made of a pure metal having a melting point of not more than 260° C., the semiconductor device can be prevented from being defectively mounted resulting from defective melting of the metal plating layer when mounted on the package board (in reflow treatment).

A method of manufacturing a semiconductor device of the present invention using a lead frame integrally including a die pad, a lead arranged around the die pad to extend in a direction opposed to the die pad and a support portion connected with an end of the lead farther from the die pad, includes a bonding step of die-bonding a semiconductor chip onto the die pad and electrically connecting the semiconductor chip and the lead with each other with a bonding wire, a sealing step of sealing the semiconductor chip with sealing resin along with the lead frame so that a second surface of the lead opposite to a first surface connected with the bonding wire is exposed from the sealing resin after the bonding step, a removing step of removing the support portion and the sealing resin on the support portion and exposing a third surface of the lead orthogonal to the second surface from the sealing resin, and a plating step of forming a metal plating layer made of a pure metal on the exposed third surface of the lead by electroless plating.

According to this method, the semiconductor chip and the lead are electrically connected with each other by connecting one and the other ends of the bonding wire to the semiconductor chip and the first surface of the lead of the lead frame respectively after the semiconductor chip is die-bonded to the die pad. Thereafter the semiconductor chip is sealed with the sealing resin along with the lead frame so that the second surface of the lead opposite to the first surface is exposed from the sealing resin. Then, the support portion and the sealing resin on the support portion are removed, so that the third surface of the lead orthogonal to the second surface is exposed from the sealing resin. Then, the metal plating layer made of a pure metal is formed on the exposed third surface of the lead by electroless plating. Thus, the aforementioned semiconductor device can be obtained.

Preferably, the removing step is a step of removing the support portion and the sealing resin on the support portion by cutting with a dicing saw, and the method further includes an etching step for removing a flash formed on the lead in the removing step by etching in advance of the plating step.

The removing step is a step of removing the support portion and the sealing resin on the support portion by cutting with the dicing saw. When the support portion is removed, i.e., the lead is separated from the support portion, therefore, the material forming the lead may spread following the dicing saw, to form a flash on the lead. In this case, the flash comes into contact with a land of a package board when the semiconductor device is mounted on the package board, and the semiconductor device floats up from the package board due to the flash. When reflow treatment is performed in this state, defective packaging such as defective connection between the lead and the land may result from thermal warp of the package board.

The flash formed on the lead is removed through the etching step carried out in advance of the plating step. Thus, the semiconductor device can be prevented from being defectively packaged resulting from the flash.

BRIEF DESCRIPTION OF THE DRAWINGS

FIG. 4A is a schematic sectional view showing a step of manufacturing the semiconductor device.

FIG. 4C is a schematic sectional view showing the next step of FIG. 4B.

FIG. 4D is a schematic sectional view showing the next step of FIG. 4C.

FIG. 4E is a schematic sectional view showing the next step of FIG. 4D.

FIG. 4G is a schematic sectional view showing the next step of FIG. 4F.

FIG. 4H is a schematic sectional view showing the next step of FIG. 4G.

BEST MODE FOR CARRYING OUT THE INVENTION

Figure 1A:
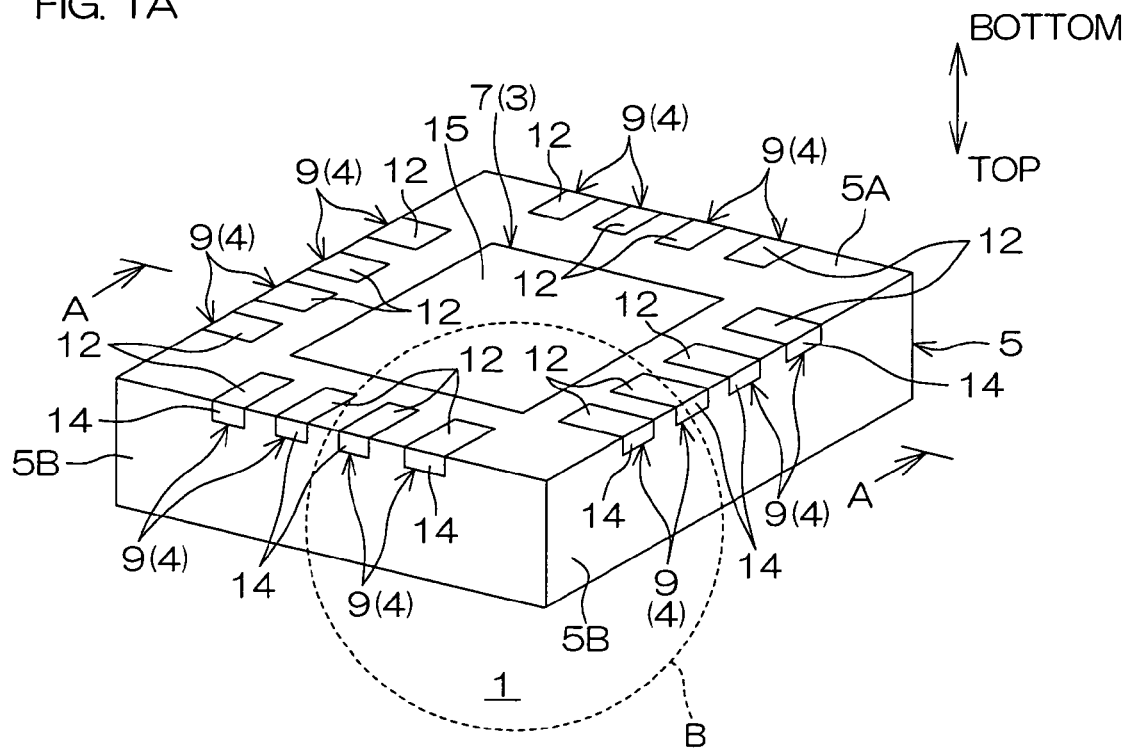
FIG. 1A is a schematic perspective view of a semiconductor device according to an embodiment of the present invention as viewed obliquely from above.
Figure 1B:
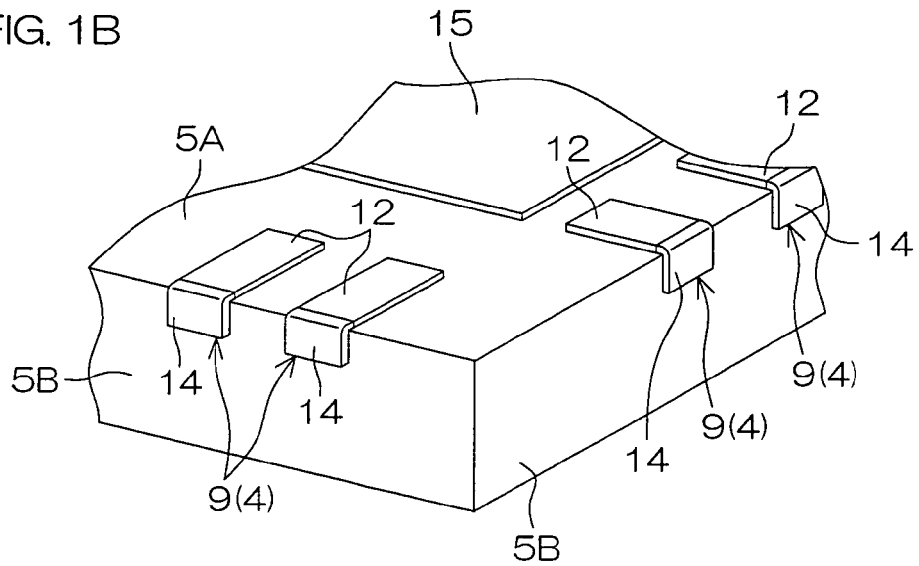
FIG. 1B is an enlarged view of apart of the semiconductor device surrounded by a broken circle B in FIG. 1A.
Figure 2:
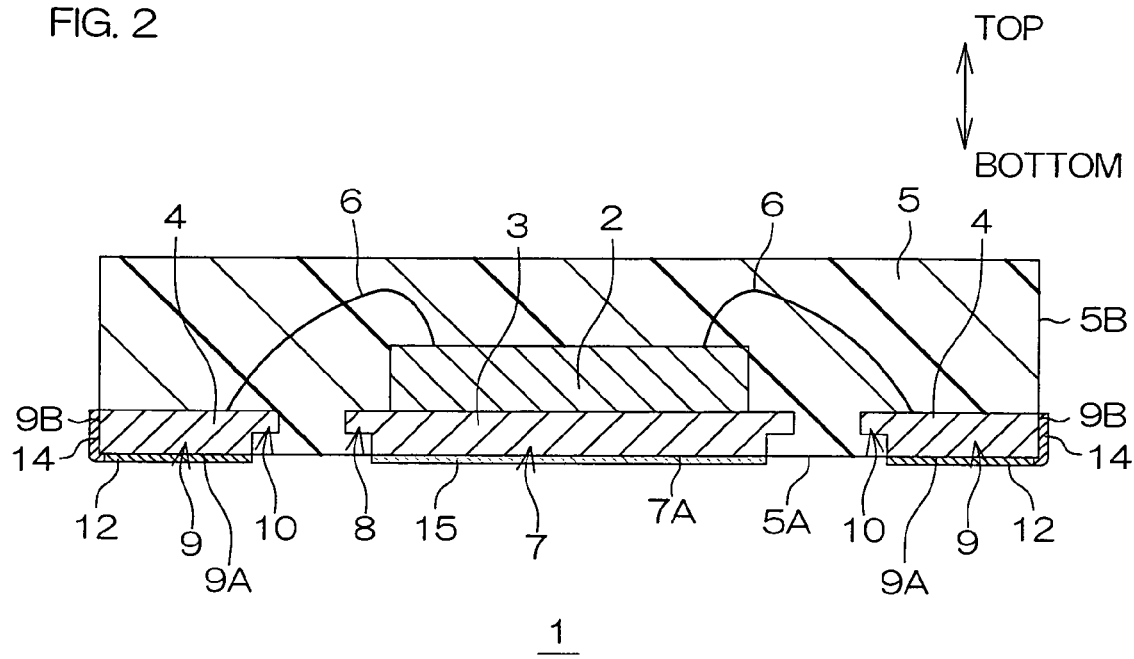
FIG. 2 is a schematic sectional view of the semiconductor device taken along the line A-A in FIG. 1A.

FIG. 1A is a schematic perspective view of a semiconductor device 1 according to an embodiment of the present invention as viewed obliquely from above. FIG. 1B is an enlarged view of a part of the semiconductor device 1 surrounded by a broken circle B in FIG. 1A. FIG. 2 is a schematic sectional view of the semiconductor device 1 taken along the line A-A in FIG. 1A.

A QFN is applied to the semiconductor device 1. This semiconductor device 1 includes a semiconductor chip 2, a die pad 3 supporting the semiconductor chip 2, a plurality of leads 4 electrically connected with the semiconductor chip 2 and sealing resin 5 sealing these elements.

The semiconductor chip 2 is die-bonded onto the die pad 3 while directing the surface (device forming surface) provided with functional elements upward. A plurality of pads (not shown) are formed on the surface of the semiconductor chip 2 by partially exposing a wiring layer from a surface protective film. The respective pads are electrically connected with the leads 4 through bonding wires 6 formed of thin gold wires.

The die pad 3 and the leads 4 are formed by metal thin plates, as described later.

The die pad 3 integrally includes a body portion 7 rectangular in plan view and a stop portion 8 surrounding the body portion 7 in the form of a rectangular frame in plan view.

The body portion 7 has a lower surface 7A exposed from a lower surface 5A of the sealing resin 5. A metal plating layer 15 is formed on a lower surface 7A of the body portion 7 exposed from the lower surface 5A of the sealing resin 5.

The metal plating layer 15 is made of a metal having solder wettability such as tin (Sn), a tin-silver alloy (Sn—Ag), a tin-bismuth alloy (Sn—Bi), a tin-copper alloy (Sn—Cu) or palladium (Pd). The thickness of the metal plating layer 15 is not more than 15 μm, and about 10 μm on the average, for example. If the metal plating layer 15 is made of Pd, for example, the thickness of the metal plating layer 15 is about 5 μm.

The stop portion 8 has a smaller thickness than the body portion 7. The upper surface of the stop portion 8 is flush with the upper surface of the body portion 7. When the leads 4 are resin-sealed along with the semiconductor chip 2, the sealing resin 5 extends toward the portion located under the stop portion 8, thereby preventing the die pad 3 from coming off from the sealing resin 5.

The leads 4 are provided on both sides in the respective directions orthogonal to the respective side surfaces of the die pad 3 in the same numbers respectively. The leads 4 opposed to each side surface of the die pad 3 are arranged at regular intervals in the direction parallel to the side surface.

Each lead 4 is in the form of a rectangle elongated in the direction orthogonal to the corresponding side surface of the die pad 3 (direction opposed to the die pad 3) in plan view. Each lead 4 integrally includes a body portion 9 and a stop portion 10 formed by crushing an end closer to the die pad 3 from under the lower surface.

The body portion 9 has a lower surface (joint surface) 9A exposed from the lower surface 5A of the sealing resin 5 and a longitudinal end surface 9B exposed from a corresponding side surface 5B of the sealing resin 5.

A metal plating layer 12 is formed on the lower surface 9A of the body portion 9 exposed from the lower surface 5A of the sealing resin 5.

The metal plating layer 12 is made of a metal having solder wettability such as tin (Sn), a tin-silver alloy (Sn—Ag), a tin-bismuth alloy (Sn—Bi), a tin-copper alloy (Sn—Cu) or palladium (Pd). The thickness of the metal plating layer 12 is not more than 15 µm and about 10 µm on the average, for example. If the metal plating layer 12 is made of Pd, for example, the thickness of the metal plating layer 12 is about 5 µm.

Another metal plating layer 14 is formed on the end surface 9B of the body portion 9 exposed from the corresponding side surface 5B of the sealing resin 5.

The metal plating layer 14 is made of a pure metal such as tin (Sn) or indium (In), for example. The thickness of the metal plating layer 14 is not more than 3 µm and not more than 1 µm on the average, for example.

On the other hand, the upper surface of the body portion 9 is sealed in the sealing resin 5. This upper surface of the body portion 9 serves as an inner lead, and is connected with the corresponding bonding wire 6.

The stop portion 10 has a smaller thickness than the body portion 9. The upper surface of the stop portion 10 is flush with the upper surface of the body portion 9, and the lower surface of the stop portion is recessed relative to a lower surface of the body portion. When each lead 4 is resin-sealed along with the semiconductor chip 2, the sealing resin 5 extends toward the portion located under the stop portion 10, thereby prevention displacement of the lead 4 from the sealing resin 5.

Figure 3:
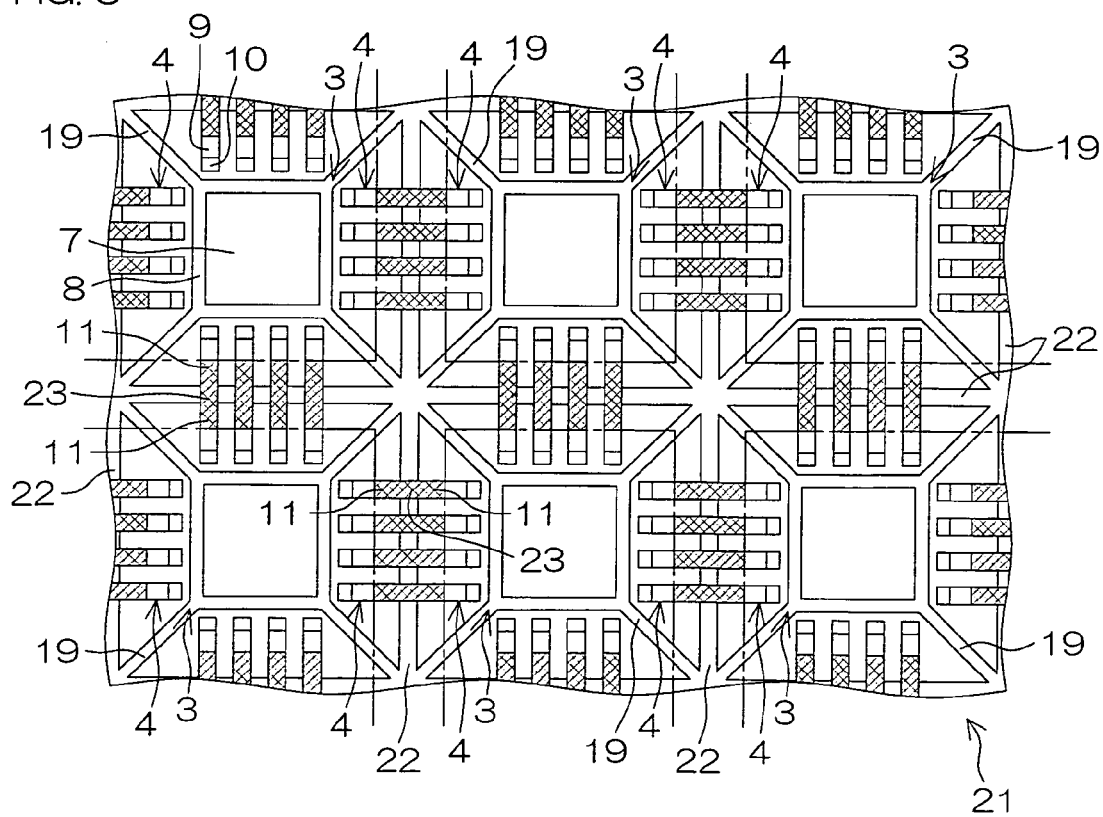
FIG. 3 is a bottom plan view partially showing a lead frame employed for manufacturing the semiconductor device.

FIG. 3 is a bottom plan view partially showing a lead frame 21 employed for manufacturing the semiconductor device 1.

The semiconductor device 1 is manufactured in an MAP system employing a lead frame 21, as described later.

The lead frame 21 is formed by working a thin plate of a metal (copper, 42 alloy or the like, for example). This lead frame 21 integrally includes a latticed support portion 22, the die pad 3 arranged in each rectangular region surrounded by the support portion 22, and the plurality of leads 4 arranged around the die pad 3.

The die pad 3 is supported by suspension leads 19 extended between the respective corners thereof and the support portion 22.

An end of each lead 4 opposite to the die pad 3 is connected to the support portion 22. Between adjacent die pads 3, each of the leads 4 arranged around one die pad 3 and each of the leads 4 arranged around the other die pad 3 are opposed to each other along the longitudinal direction of the leads 4 through the support portion 22, to linearly extend. Grooves 11 of the leads 4 opposed to each other through the support portion 22 communicate with each other through a groove 23 formed in the support portion 22 with the same depth and the same width as the grooves 11. In other words, the grooves 11 and the groove 23 define a single groove extending in the longitudinal direction of the leads 4 between the ends of the leads 4 opposed to each other through the support portion 22. Referring to FIG. 3, the grooves 11 and 23 are shown in a crosshatched manner, for facilitating simple understanding of the illustration.

FIGS. 4A to 4H are schematic sectional views sequentially showing the process of manufacturing the semiconductor device 1.

Figure 4B:
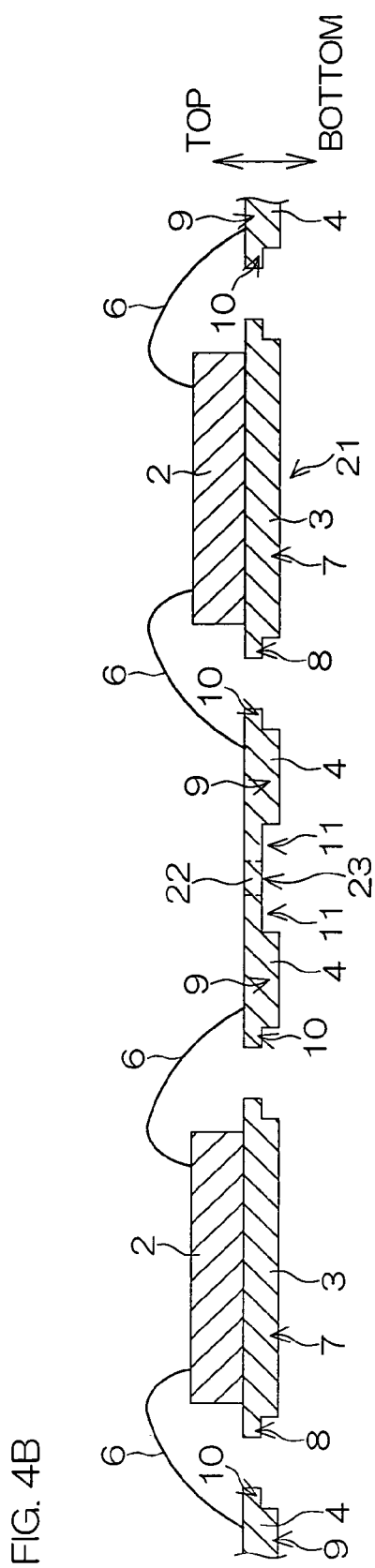
FIG. 4B is a schematic sectional view showing the next step of FIG. 4A.

In the process of manufacturing the semiconductor device 1, the lead frame 21 is prepared in the first place, as shown in FIG. 4A. FIGS. 4A to 4H illustrate only a cut area of the lead frame 21.

First, semiconductor chips 2 are die-bonded to the die pads 3 provided on the lead frame 21 through a bonding agent (not shown) made of high melting point solder (solder having a melting point of not less than 260° C.), for example, as shown in FIG. 4B. Then, the respective ends of the respective bonding wires 6 are connected to pads of the semiconductor chips 2, and the other respective ends of the bonding wires 6 are connected (wire-bonded) to the upper surfaces (first surfaces) of the leads 4 (bonding step).

When all the semiconductor chips 2 are completely wire-bonded, the lead frame 21 is set in a molding die, and all the semiconductor chips 2 provided on the lead frame 21 are collectively sealed with sealing resin 32 along with the lead frame 21 (sealing step), as shown in FIG. 4C.

Then, metal plating layers (metal plating layers 15 and 12) are formed by electrolytic plating, for example, on the lower surface of the lead frame 21 (lower surfaces 7A of body portions 7 of the die pads 3 and lower surfaces 9A (second surfaces) of body portions 9 of the leads 4) exposed from the sealing resin 32 as shown in FIG. 4D.

Then, a dicing saw 33 having a width greater than the sum of the widths of the grooves 11 and 23 is introduced from under the lower surface of a support portion 22 of the lead frame 21 along a dicing line set on the support portion 22, to remove the support portion 22, the sealing resin 32 on the support portion 22, portions of the leads 4 (the entire grooves 11 of the leads 4 in this embodiment) present on regions of a predetermined width located on both sides of the support portion 22, and the sealing resin 32 on the leads 4 (removing and dicing steps), as shown in FIG. 4E. In other words, portions of the lead frame 21 and the sealing resin 32 present on zonal regions sandwiched between two-dot chain lines in FIG. 3 are removed. Thus, the leads 4 are separated from the support portion 22, the divided sealing resin 32 forms the sealing resins 5, and each individual semiconductor device 1 can be obtained.

Figure 4F:
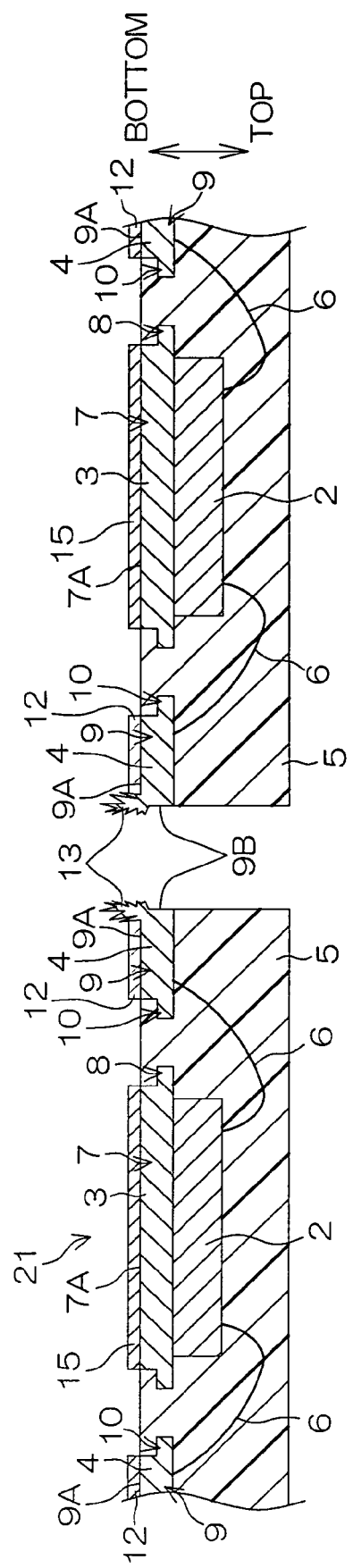
FIG. 4F is a schematic sectional view showing the next step of FIG. 4E.
Figure 5:
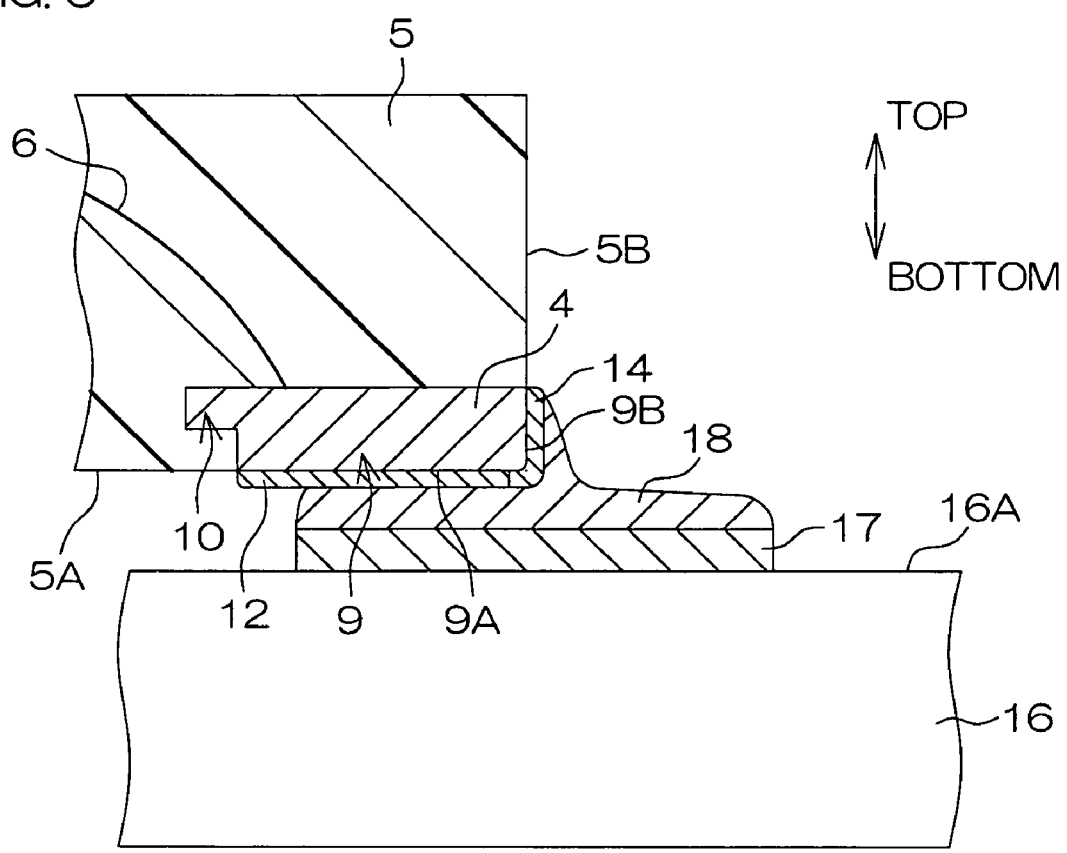
FIG. 5 is a schematic enlarged view showing a part of the semiconductor device shown in FIG. 1A mounted on a package board.

The dicing saw 33 has the width greater than the sum of the widths of the grooves 11 and 23, and hence the side surface of the dicing saw 33 comes into contact with the leads 4 and the sealing resin 32 (sealing resins 5) at the time of cutting (dicing) by the dicing saw 33. Therefore, the leads 4 may extend following the side surface of the dicing saw 33, to form flashes 13 on ends of the lower surfaces 9A of the leads 4 (body portions 9) closer to end surfaces (third surfaces) 9B, as shown in FIG. 4F. When the semiconductor device 1 is mounted on a package board 16 (described later) as shown in FIG. 5, therefore, the flashes 13 come into contact with a land 17 (described later) of the package board 16, and the semiconductor device 1 floats up from the package board 16 on the portions of the flashes 13. If reflow treatment is performed in this state, defective packaging such as defective connection between the lead 4 and the land 17 may result from thermal warp of the package board 16.

According to this embodiment, therefore, etching is performed for removing the flashes 13 from the leads 4 (etching step) after the semiconductor device 1 is cut with the dicing saw 33 (after the dicing step).

Wet etching or dry etching, for example, is employed for the etching step. In the wet etching, an etching solution (chlorine-based etching solution such as ferric chloride (FeCl₃), for example) capable of dissolving the material (copper or 42 alloy, for example) for the leads 4 is supplied to the semiconductor device 1. Thus, even when the flashes 13 are formed, the flashes 13 are dissolved and removed, the end surfaces 9B of the leads 4 (body portions 9) are planarized, and the end surfaces 9B of the leads 4 (body portions 9) and the corresponding side surfaces 5B of the sealing resin 5 are flush with each other, as shown in FIG. 4G.

Thereafter metal plating layers 14 are formed on the end surfaces 9B of the leads 4 (body portions 9) (plating step), as shown in FIG. 4H. The metal plating layers 14 are formed by electroless plating. Thus, the metal plating layers 14 are formed on the end surfaces 9B of the leads 4 (body portions 9), and the semiconductor device 1 having the structure shown in FIG. 1A is obtained.

FIG. 5 is a schematic enlarged view showing a part of the semiconductor device 1 shown in FIG. 1A mounted on the package board 16.

The semiconductor device 1 obtained in the aforementioned manner is mounted on the package board 16.

The package board 16 is provided with the land 17 on the upper surface 16A thereof, and cream solder 18 is applied to the surface of the land 17. The cream solder 18 is prepared by creaming lead-free solder such as a tin-silver alloy (Sn—Ag), a tin-silver-copper alloy (Sn—Ag—Cu) or a tin-bismuth alloy (Sn—Bi) or lead-containing solder such as a lead-tin alloy (Pb—Sn), for example, with a solvent and a flux.

The semiconductor device 1 is mounted on the package board 16 by a reflow system, for example. At the mounting by the reflow system, the package board 16 provided with the land 17 having the surface coated with the cream solder 18 is prepared in the first place, and the semiconductor device 1 is arranged on a position where the surface of the land 17 and the lower surfaces 9A of the leads 4 (body portions 9) are opposed to one another. In this state, the package board 16 is introduced into a reflow furnace, and preheated at a predetermined temperature along with the semiconductor device 1. Thereafter the package board 16 and the semiconductor device 1 are heated to a reflow temperature (260° C., for example) not less than the melting point (about 220° C. if the cream solder 18 is prepared from a tin-silver alloy) of the cream solder 18. Thus, the cream solder 18 as well as the metal plating layers 12 and 14 are melted. Consequently, the cream solder 18 is integrated with the lower surfaces 9A and the end surfaces 9B of the leads 4 (body portions 9), and the semiconductor device 1 is completely mounted on the package board 16.

In this semiconductor device 1, the metal plating layers 14 are formed on the end surfaces 9B of the leads 4 (body portions 9), whereby the cream solder 18 can be wet onto the end surfaces 9B of the leads 4 (body portions 9). Consequently, the mounting strength of the semiconductor device 1 with respect to the package board 16 can be improved, thereby improving the packaging reliability. Further, the so-called solder fillets can be formed on the end surfaces 9B of the leads 4 (body portions 9), whereby the appearance test of the bonded (soldered) state between the leads 4 and the package board 16 can be easily performed.

The metal plating layers 14 are made of the pure metal such as tin (melting point: 231.97° C.) or indium (melting point: 156.6° C.) having a melting point not more than 260° C., whereby defective mounting resulting from defective melting of the metal plating layers 14 can be prevented when the semiconductor device 1 is mounted on the package board 16.

Further, the flashes 13 (see FIG. 4F) which may be formed on the leads 4 when the semiconductor device 1 is cut with the dicing saw 33 (dicing step) are removed by etching in advance of the plating step of forming the metal plating layers 14, whereby the semiconductor device 1 does not float up from the package board 16. Consequently, the semiconductor device 1 can be prevented from being defectively mounted resulting from flashes.

While the embodiment of the present invention has been described, the present invention can be carried out in another embodiment. For example, while the above embodiment is described with reference to the semiconductor device 1 to which the QFN is applied, the present invention is also applicable to a semiconductor device to which another non-leaded package such as a SON (Small Outlined Non-leaded Package) is applied.

Further, the present invention is not restricted to the so-called singulation type semiconductor device provided with leads having end surfaces flush with the side surface of sealing resin but is also applicable to a semiconductor device to which a lead-cut type non-leaded package provided with leads protruding from the side surface of sealing resin is applied.

In addition, the present invention is not restricted to the non-leaded package but is also applicable to a semiconductor device to which a package having outer leads protruding from sealing resin is applied.

Moreover, the semiconductor device according to the present invention may be manufactured by a discretely sealing individual semiconductor chips in place of the MAP system.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-99221 filed with the Japanese Patent Office on Apr. 5, 2007, the disclosure of which is incorporated herein by reference.

What is claimed is:

1. A semiconductor device comprising:
   a semiconductor chip; and
   a lead arranged around the semiconductor chip to extend in a direction intersecting with a side surface of the semiconductor chip, and having at least an end farther from the semiconductor chip bonded to a package board, wherein
   a joint surface to the package board and an end surface orthogonal to the joint surface are formed on the end of the lead farther from the semiconductor chip,
   a first metal plating layer is formed on the joint surface, and
   a second metal plating layer made of a pure metal different from a metal forming the first metal plating layer is formed on the end surface wherein the first and the second metal plating layers are in direct contact with the lead.

2. The semiconductor device according to claim 1, wherein the second metal plating layer is made of a pure metal having a melting point of not more than 260° C.

3. A method of manufacturing a semiconductor device using a lead frame integrally comprising a die pad, a lead arranged around the die pad to extend in a direction opposed to the die pad and a support portion connected with an end of the lead farther from the die pad, comprising:
- a bonding step of die-bonding a semiconductor chip onto the die pad and electrically connecting the semiconductor chip and the lead with each other with a bonding wire;
- a sealing step of sealing the semiconductor chip with sealing resin along with the lead frame so that a second surface of the lead opposite to a first surface connected with the bonding wire is exposed from the sealing resin after the bonding step;
- a first plating step of forming a first metal plating layer on the exposed second surface of the lead by electrolytic plating after the sealing step:
- a removing step of removing the support portion and the sealing resin on the support portion and exposing a third surface of the lead orthogonal to the second surface from the sealing resin; and
- a second plating step of forming a second metal plating layer made of a pure metal different from a metal forming the first metal plating layer on the exposed third surface of the lead by electroless plating.

4. The method of manufacturing a semiconductor device according to claim 3, wherein
- the removing step is a step of removing the support portion and the sealing resin on the support portion by cutting with a dicing saw, and
- the method further comprises an etching step for removing a flash formed on the lead in the removing step by etching in advance of the second plating step.

5. The semiconductor device according to claim 1, wherein the thickness of the second metal plating layer is not more than 3 μm.

6. The semiconductor device according to claim 1, wherein the second metal plating layer is made of tin (Sn) or indium (In).

7. The semiconductor device according to claim 1, wherein the semiconductor device further comprises a die pad supporting the semiconductor chip and having a lower surface bonded to the package board,
- a third metal plating layer made of a metal same as the metal forming the first metal plating layer is formed on the lower surface of the die pad, and
- the first and third metal plating layers are made of tin (Sn), a tin-silver alloy (Sn—Ag), a tin-bismuth alloy (Sn—Bi), a tin-copper alloy (Sn—Cu) or palladium (Pd), each.

8. The semiconductor device according to claim 7, wherein the thickness of the first and third metal plating layers is not more than 15 μm.

9. The semiconductor device according to claim 1, wherein the lead is made of copper (Cu) or 42 alloy.

10. The semiconductor device according to claim 1, wherein
- the semiconductor device further comprises a die pad supporting the semiconductor chip,
- the lead is in an elongated form in a direction opposite to the die pad, and has a body portion, the body portion having a lower surface that defines the joint surface, the lead further having a stop portion at an end closer to the die pad, the stop portion having an upper surface that is flush with an upper surface of the body portion, and a lower surface that is recessed relative to the lower surface of the body portion.

11. The semiconductor device according to claim 1, wherein the first metal plating layer is formed primarily on the joint surface so as to not be on the end surface, and the second metal plating layer is formed primarily on the end surface to adjoin the first metal plating layer.

12. The method of manufacturing a semiconductor device according to claim 3, wherein the first metal plating layer is formed primarily on the exposed second surface so as to not be on the third surface, and the second metal plating layer is formed primarily on the exposed third surface to adjoin the first metal plating layer.

13. The semiconductor device according to claim 1, wherein the first metal plating layer is formed directly on the joint surface, and the second metal plating layer is formed directly on the end surface.

14. The method of manufacturing a semiconductor device, according to claim 3, wherein the first metal plating layer is formed directly on the exposed second surface, and the second metal plating layer is formed directly on the exposed third surface.

* * * * *